(12) United States Patent
Li

(10) Patent No.: US 8,979,308 B2
(45) Date of Patent: Mar. 17, 2015

(54) LED ILLUMINATION SYSTEM WITH RECYCLED LIGHT

(75) Inventor: Kenneth Li, Castaic, CA (US)

(73) Assignee: Wavien, Inc., Valencia, CA (US)

( * ) Notice: Subject to any disclaimer, the term of this patent is extended or adjusted under 35 U.S.C. 154(b) by 660 days.

(21) Appl. No.: 13/077,006

(22) Filed: Mar. 31, 2011

(65) Prior Publication Data

US 2011/0242836 A1 Oct. 6, 2011

Related U.S. Application Data

(63) Continuation-in-part of application No. 12/542,341, filed on Aug. 17, 2009, now Pat. No. 8,317,331.

(60) Provisional application No. 61/320,070, filed on Apr. 1, 2010, provisional application No. 61/382,189, filed on Sep. 13, 2010.

(51) Int. Cl.
| | |
|---|---|
| *F21S 4/00* | (2006.01) |
| *H01L 33/60* | (2010.01) |
| *F21V 7/04* | (2006.01) |
| *F21Y 101/02* | (2006.01) |
| *H01L 25/075* | (2006.01) |
| *H01L 33/58* | (2010.01) |

(52) U.S. Cl.
CPC . *H01L 33/60* (2013.01); *F21V 7/04* (2013.01); *F21Y 2101/02* (2013.01); *H01L 25/0753* (2013.01); *H01L 33/58* (2013.01)
USPC .. 362/249.06; 362/231; 362/235; 362/249.02

(58) Field of Classification Search
CPC .................... F21Y 2105/001; F21Y 2105/003; F21K 9/00
USPC .......... 362/231, 235, 249.02, 249.06
See application file for complete search history.

(56) References Cited

U.S. PATENT DOCUMENTS

| | | |
|---|---|---|
| 5,005,108 A | 4/1991 | Pristash et al. |
| 5,142,387 A | 8/1992 | Shikama et al. |
| 5,400,426 A | 3/1995 | de Jong et al. |
| 5,982,540 A | 11/1999 | Koike et al. |
| 6,144,536 A | 11/2000 | Zimmerman et al. |
| 6,227,682 B1 | 5/2001 | Li |
| 6,341,876 B1 | 1/2002 | Moss et al. |
| 6,869,206 B2 | 3/2005 | Zimmerman et al. |
| 7,052,150 B2 | 5/2006 | Dewald |
| 7,390,116 B2 | 6/2008 | Jain |
| 7,494,228 B2 | 2/2009 | Harbers et al. |
| 2001/0026450 A1 | 10/2001 | Li |
| 2004/0002169 A1 | 1/2004 | Kraus et al. |
| 2004/0233679 A1 | 11/2004 | Ferri et al. |
| 2005/0002169 A1 | 1/2005 | Drazic et al. |

(Continued)

OTHER PUBLICATIONS

Hoepfner: "61.1: Invited Paper: PhlatLight™ Photonic Lattice LEDs for RPTV Light Engines," SID 06 Digest, I808-1811 (2006).

(Continued)

*Primary Examiner* — Sean Gramling
(74) *Attorney, Agent, or Firm* — Abelman, Frayne & Schwab

(57) ABSTRACT

An LED illumination system includes at least one LED element and a recycling reflector having a transmissive aperture through which emitted light passes. The recycling reflector has a curved surface adapted to reflect the impinging light back to the LED element for improved light output through the transmissive aperture.

10 Claims, 13 Drawing Sheets

(56) References Cited

U.S. PATENT DOCUMENTS

| | | |
|---|---|---|
| 2005/0207177 A1 | 9/2005 | Guy |
| 2005/0225866 A1 | 10/2005 | Abu-Ageel |
| 2006/0008237 A1 | 1/2006 | Imade |
| 2006/0062013 A1 | 3/2006 | Imade |
| 2006/0081773 A1* | 4/2006 | Rains et al. .................. 250/228 |
| 2006/0203352 A1 | 9/2006 | Pashley |
| 2006/0227302 A1 | 10/2006 | Harbers et al. |
| 2006/0262514 A1 | 11/2006 | Conner et al. |
| 2007/0132958 A1 | 6/2007 | Shanley et al. |
| 2007/0236956 A1 | 10/2007 | Kolodin et al. |
| 2007/0284565 A1 | 12/2007 | Leatherdale et al. |
| 2007/0291491 A1* | 12/2007 | Li et al. .......................... 362/307 |
| 2008/0030974 A1 | 2/2008 | Abu-Ageel |
| 2009/0128781 A1 | 5/2009 | Li |
| 2010/0045937 A1 | 2/2010 | Li |

OTHER PUBLICATIONS

PCT International Search Report and Written Opinion mailed Aug. 17, 2011 for PCT/US11/30696.

* cited by examiner

LED ILLUMINATION SYSTEM WITH RECYCLED LIGHT

CROSS REFERENCE TO RELATED APPLICATIONS

This application is a continuation-in-part of prior U.S. patent application Ser. No. 12/542,341, filed on Aug. 17, 2009, now U.S. Pat. No. 8,317,331. This application further claims the benefit of priority under 35 U.S.C. §119(e) to U.S. provisional application Ser. No. 61/320,070, filed on Apr. 1, 2010, and Provisional Application Ser. No. 61/382,189 filed on Sep. 13, 2010.

FIELD OF THE INVENTION

The present invention relates to a light illumination system and more particularly to an LED illumination system.

BACKGROUND OF THE INVENTION

For many illumination applications such as an LED (light emitting diode) illumination application, color change can be achieved by using various color LED elements that emit light of a particular color. Typically, three primary color LED elements are used to generate a desired color image. The three primary colors are red, green and blue (RGB). Thus, red, green and blue LED elements are used to generate the desired color image. In some applications, other primary color LEDs such as yellow, cyan and magenta LED elements are also used in addition to RGB to produce fuller and brighter color images.

Many LED illumination applications such as projection displays require an illumination system with a high level of brightness in a small effective emitting area. This high level of brightness can be accomplished conventionally by adding more light sources. However, these conventional methods can be both technologically impossible if there is a limited space for integrating light sources and economically impractical as it can be very expensive to integrate and use multiple light sources. An alternate method of increasing the brightness is to use larger lenses to try to collect as much light as possible. This can also be very impractical as larger accurate lenses can be quite expensive to manufacture and integrate into an illumination system.

Therefore, it would be desirable to provide an illumination system and method of increasing the light output in a simple and economical manner for a given light source.

SUMMARY OF THE DISCLOSURE

According to one aspect of the present invention, an LED illumination system includes at least one LED element and a recycling reflector having a transmissive aperture through which emitted light passes. The recycling reflector has a curved surface adapted to reflect the impinging light back to the LED element for improved light output through the transmissive aperture.

According to another aspect of the present invention, an LED illumination system includes an LED array and a recycling reflector having a transmissive aperture through which emitted light passes. The LED array has at least one pair of same color LED elements arranged symmetrically about the center of the LED array. The recycling reflector has a curved surface adapted to reflect the impinging light back to the LED elements for increased light output through the transmissive aperture.

According to another aspect of the present invention, the recycling reflector has an optical axis that passes through the center of the LED array and the curved surface includes a spherical surface adapted to reflect the emitted light from one LED element back to the other LED element for increased light output through the transmissive aperture.

DETAILED DESCRIPTION OF THE INVENTION

Briefly, the present invention discloses an efficient recycling scheme in which the colored LED elements can be mixed and the etendue can be reduced. The light recycling method involves 1) providing a recycling reflector having a curved reflective surface or 2) arranging the colored LED elements in a symmetric pattern with respect to the center of the LED package/optical axis of the recycling reflector or both to substantially increase the light output.

Figure 1:
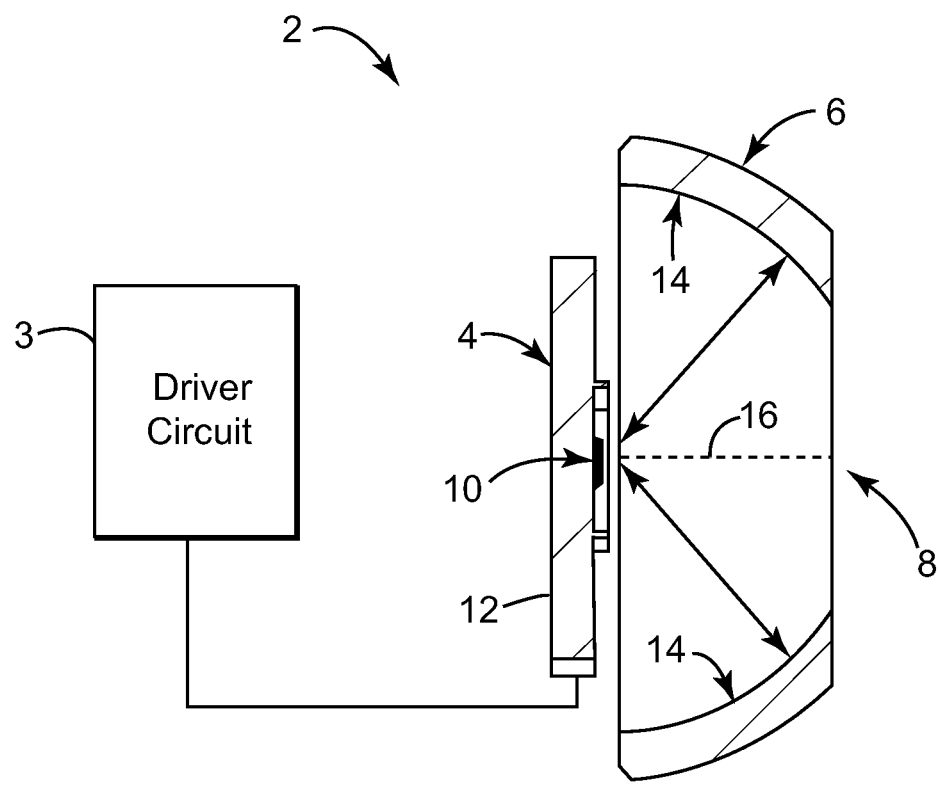
FIG. 1 shows an LED illumination system with a recycling reflector according to an embodiment of the present invention.

FIG. 1 shows an LED illumination system with a recycling reflector according to one embodiment of the present invention. The illumination system 2 can be used with any LED array as shown herein. The illumination system 2 includes an LED package/chip 4, a driver circuit 3 for driving the LED chip, a recycling reflector 6 such as a recycling collar positioned in front of the LED chip and a transmissive aperture 8 through which the LED light passes.

The LED package 4 typically includes one or more LED elements 10 having an emitting area that emits light and a substrate 12 on which the LED elements are mounted. Such LED packages, for example, are available from Luminus Devices, Inc. of Billerica, Mass. The LED elements 10 are arranged such that the optical axis 16 of the transmissive aperture 8 of the recycling reflector 6 goes through the center 20 (see FIG. 2) of the LED elements and the center is also substantially at the proximity of the center of curvature of the recycling reflector. The LED elements 10 are preferably arranged in the same plane and closely positioned to minimize any space between any two emitting areas of the LED elements. The LED elements 10 can emit light of a single color such as red, green and blue or emit white light. The emission angle is typically 180 degrees or less. The LED package 4 may also include a protection window (not shown) in front of the LED elements and a heat sink (not shown) attached behind the substrate 12.

The recycling collar 6 is curved in a concave manner relative to the LED element 10. The inner surface 14 is a reflective surface such that the LED light that impinges on the inner surface is reflected back to the light source, i.e., LED elements. The reflective surface can be provided by coating the exterior surface of the collar 6 or by having a separate reflective mirror attached to the collar. According to a preferred embodiment, the recycling collar 6 is spherical in shape relative to the center 20 of the LED elements 10 such that the output is reflected back to itself with unit magnification. Thus, it is effectively an imaging system where the LED elements 10 form an image on to itself. Advantageously, substantially all LED light that impinges on the inner spherical reflective surface 14 is reflected back to the light source, i.e., LED elements.

As persons of ordinary skill in the art can appreciate, any LED light that does not pass through the transmissive aperture of a conventional illumination system is lost forever. However, by using the curved reflective surface 14, the present invention allows recovery of a substantial amount of light that would have been lost. For example, in an illumination system whose transmissive aperture size captures about 20% of emitted light, the recycling collar 6 allows collection of an additional 20% of the emitted light. Advantageously, that is an improvement of 100% in captured light throughput, which results in a substantial improvement in brightness.

Figure 2:
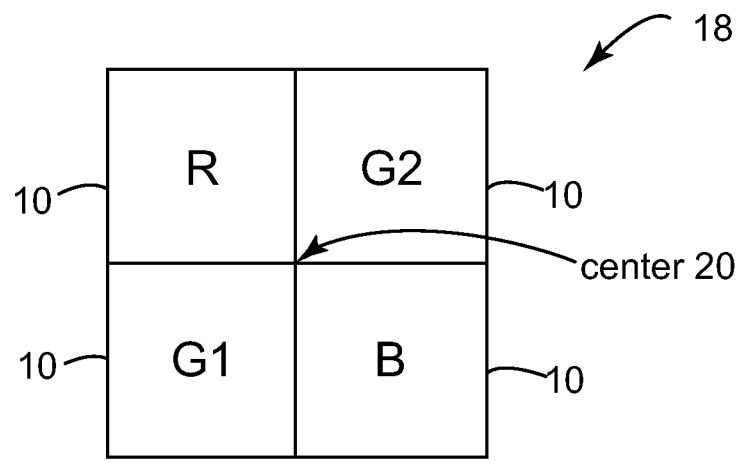
FIG. 2 shows an LED array of four LED elements with at least one symmetrically arranged colored pair according to an embodiment of the present invention.

FIG. 2 shows an LED array 18 of four colored LED elements 10 according to another embodiment of the present invention. Specifically, the LED array 18 includes one red LED element R emitting red color light, one blue LED element B emitting blue color light arranged at opposite corners and symmetrically about the center 20, and two green LED elements G1,G2 emitting green color light arranged at opposite corners and symmetrically about the center 20 of the LED array. The LED array 18 is arranged such that the optical axis 16 of the recycling reflector 6 passes through the center 20 and the center is also substantially at the proximity of the center of curvature of the recycling reflector 6.

Figure 7:
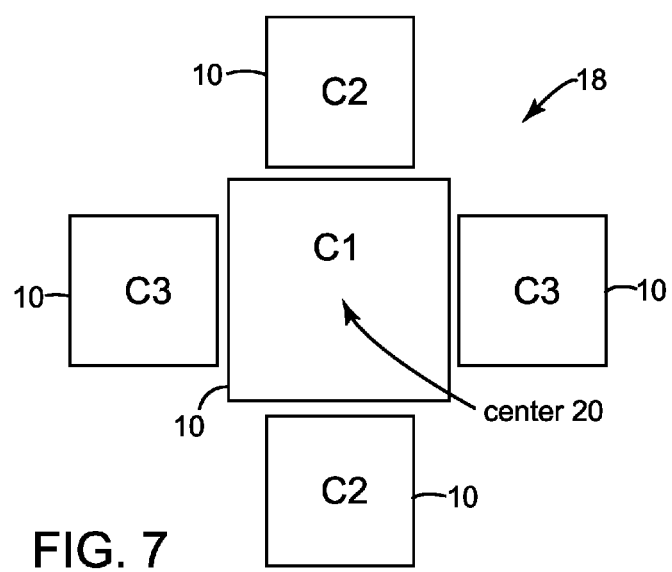
FIG. 7 shows an LED array of five symmetrically arranged LED elements according to an embodiment of the present invention.

While the LED array 18 is shown with four LED elements, the present invention can work with at least one LED element so long as the light impinging on the curved reflective surface 14 reflects back to the LED element. Also, in the case of a pair of LED elements, while it is preferable that the LED elements in the pair emit the same color, they can emit different colors although the efficiency may be lower. Moreover, the size of each LED element in the array can be different from any other LED element as illustrated in FIG. 7.

It is to be noted that while each LED element is shown as a square, it can be rectangular. Preferably, the total emitting area of the LED array 18 should have the same aspect ratio as the image to be projected. For example, to project a high definition television image whose aspect ratio is 9:16, the total emitting area of the LED array 18 should have the same 9:16 dimension. Similarly, the dimension of the LED array 18 can be, among others, 4:3, 1:1, 2.2:1, which are also popular aspect ratios.

In the embodiment of FIG. 2, the two green LED elements G1,G2 are imaged on to each other. Specifically, any light from LED element G1 impinging on the interior reflective surface 14 is reflected back to the symmetrically positioned LED element G2 and vice versa. For the symmetrically arranged same color LED elements to work well, the driver circuit 3 drives the same color LED elements (e.g., G1,G2) simultaneously. Thus, this arrangement provides high recycling efficiency. On the other hand, light from the blue LED element B is imaged onto the red LED element R and vise versa. Thus, the recycling efficiency is lower for these two colors.

Figure 3A:
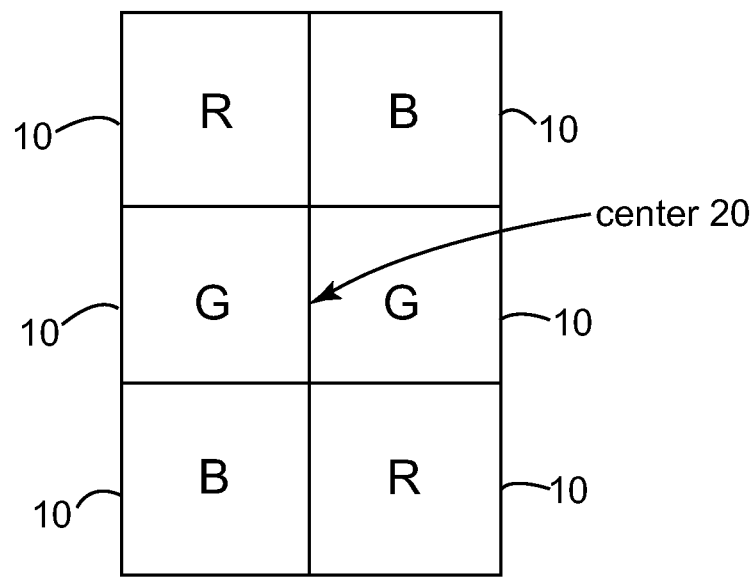
FIG. 3A shows an LED array of six symmetrically arranged LED elements according to an embodiment of the present invention.
Figure 3B:
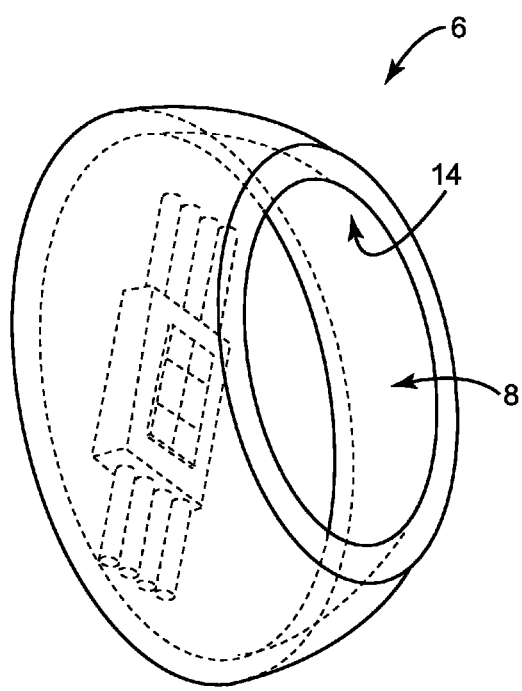
FIG. 3B shows a perspective view of an illumination system having the LED array of FIG. 3A.

In order to increase the efficiency with multi-colored LED elements, a symmetric configuration as shown in FIG. 3 can be used. In this embodiment, the red chips (LED elements R) are arranged symmetrically with respect to the center 20. As such, the red chips are imaged onto each other with high recycling efficiency. Similarly, the blue chips (LED elements B) and green chips (LED elements G) are also arranged symmetrically with respect to the center 20 and will be imaged onto each other with high recycling efficiency. FIG. 3B shows a perspective view of the recycling collar 6 of FIG. 1 and the LED array of FIG. 3A.

Figure 4A:
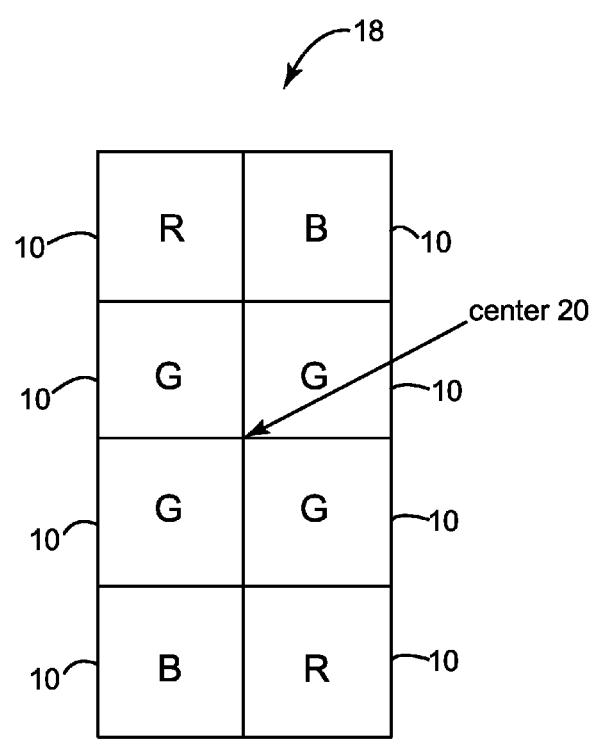
FIG. 4A shows an LED array of eight symmetrically arranged LED elements according to an embodiment of the present invention.
Figure 4B:
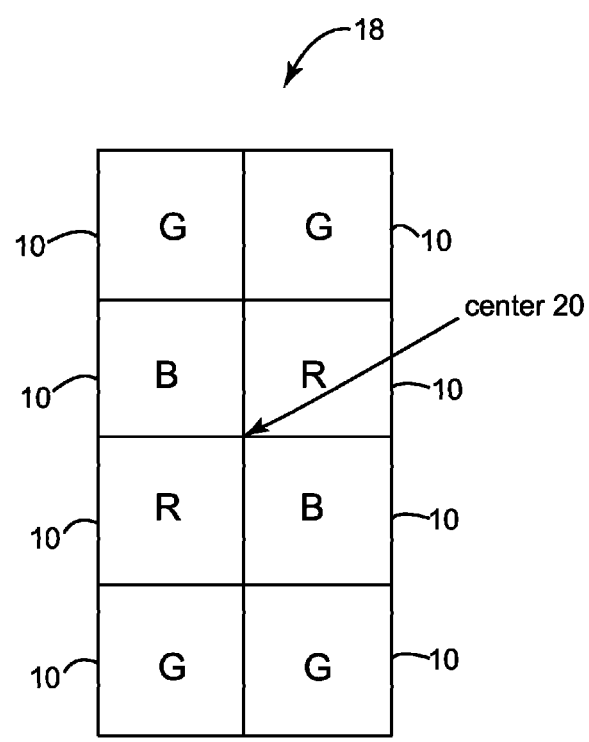
FIG. 4B shows another LED array of eight LED elements according to an embodiment of the present invention.
Figure 5:
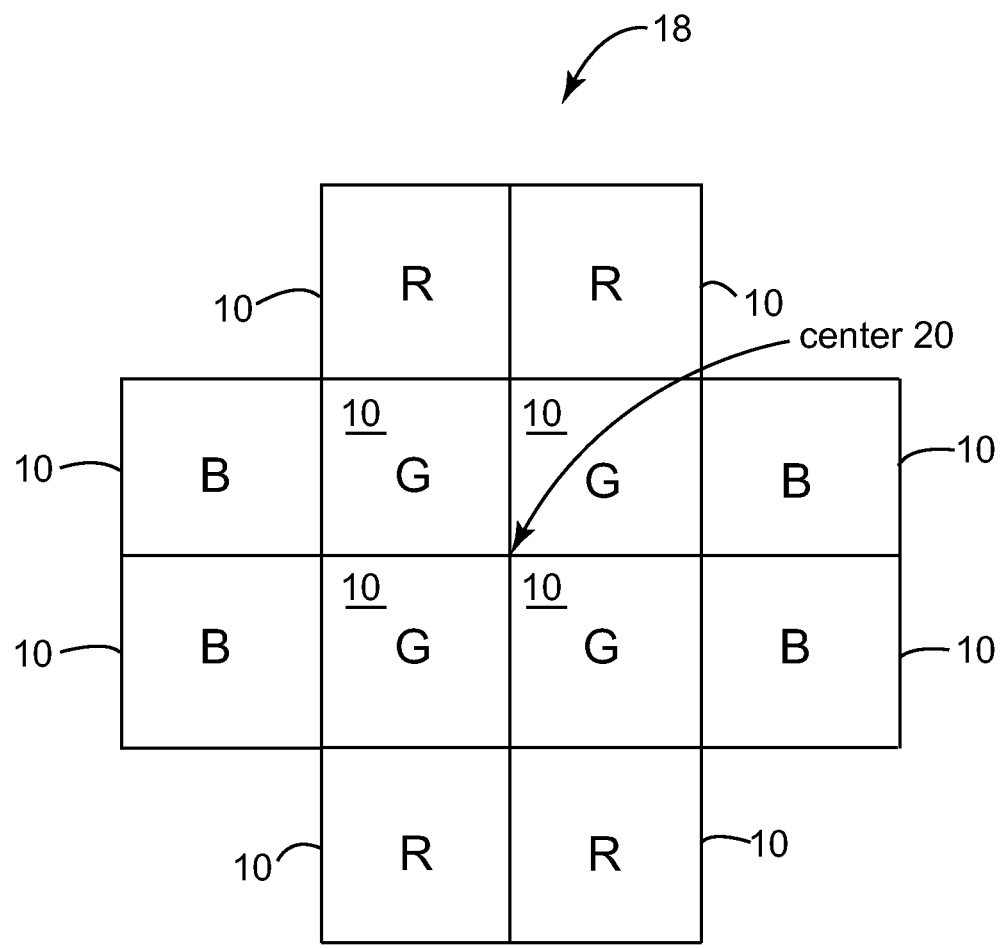
FIG. 5 shows an LED array of twelve symmetrically arranged LED elements according to an embodiment of the present invention.

FIGS. 4A, 4B and 5 show other configurations where same color LED elements (chips) 10 are placed symmetrically with respect to the center 20. In FIGS. 4A and 4B, four green LED elements, two red LED elements and two blue LED elements are placed symmetrically with respect to the center 20. In FIG. 5, four green, four red and four blue LED elements are placed symmetrically with respect to the center 20. The embodiments shown in FIGS. 4A, 4B and 5 may be particularly desirable for certain illumination applications that require very high brightness.

Figure 6:
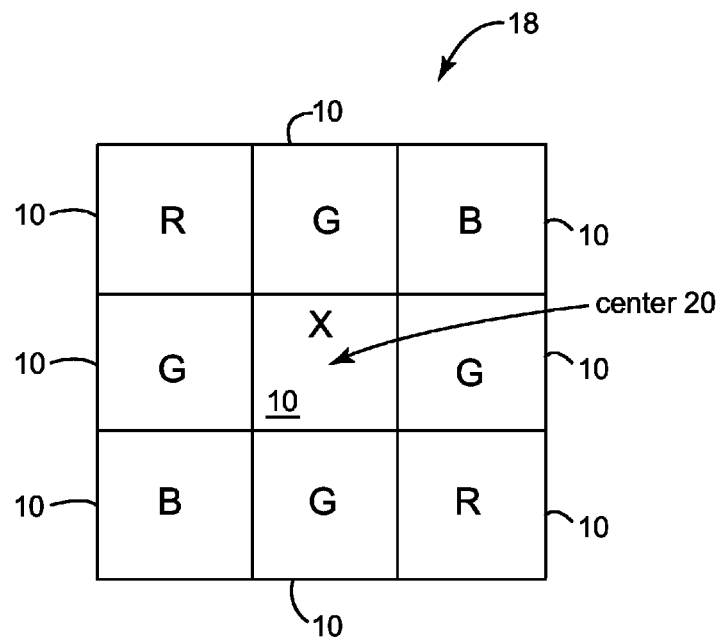
FIG. 6 shows an LED array of nine symmetrically arranged LED elements according to an embodiment of the present invention.

FIG. 6 shows an LED array of nine symmetrically arranged LED elements according to an embodiment of the present invention. In FIG. 6, the center LED element X is arranged within the perimeter of other symmetrically arranged LED elements about the center 20. In the embodiment shown, there are four green LED elements G, two red LED elements R and two blue LED elements B in the perimeter. The emitting color of the center LED element X can be any color independent of the others. The color can be red, blue, green or white or any other color for achieving the desired output for a particular imaging application. The center LED element X will be imaged onto itself as the light impinging on the reflective surface 14 from the LED element X will be reflected back to the LED element X itself.

FIG. 7 shows an LED array in which a color LED made of one or more LED elements/chips can be positioned in the center. LED elements of another color C2 can be placed anywhere symmetrically with respect to the center 20 as shown. Similarly, LED elements of another color C3 can be placed anywhere symmetrically with respect to the center 20 as shown. The size of the LED element X can be larger as shown, smaller or the same as the other LED elements depending on the particular output desired. Similarly for LED elements C2 and C3, more LED elements/chips of same or other colors can be added to increase the desired color outputs.

Figure 8A:
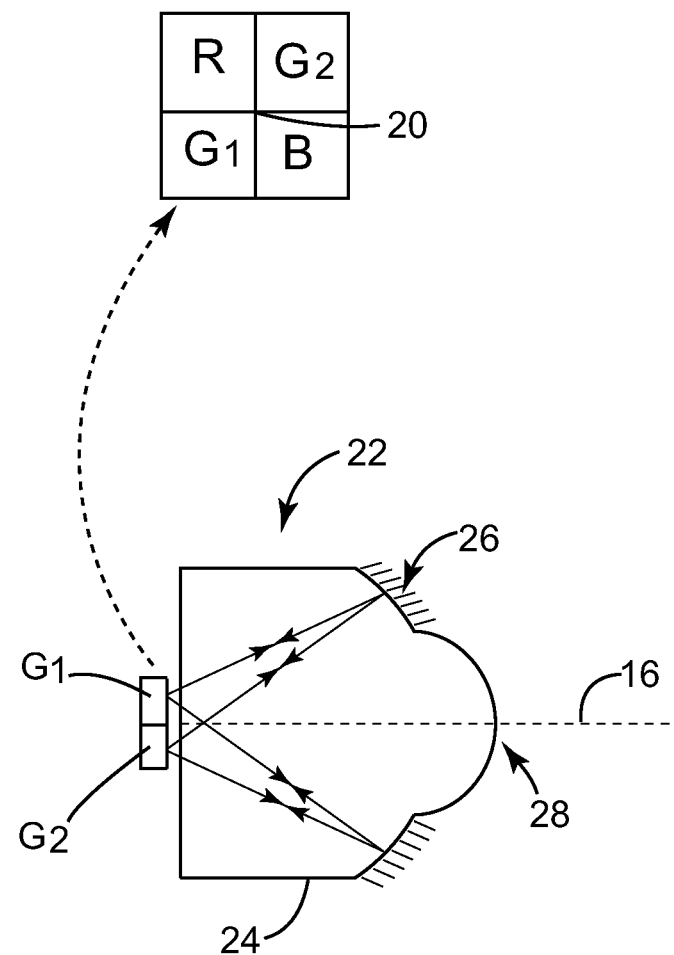
FIG. 8A shows a non-guiding optically transparent solid being used as a recycling reflector according to an embodiment of the present invention.

FIG. 8A shows an illumination system having a discrete optics element 22 being used as a recycling reflector. Element 22 is a non waveguiding optically transparent solid made with glass, acrylic, PMMA (polymethyl methacrylate) or the like.

The optically transparent solid 22 has a side wall 24, curved reflective surface 26 and a transmissive aperture 28 through which the LED light passes. The curved reflective surface 26 is preferably spherical in shape relative to the center 20. In the embodiment shown, the aperture 28 is a lens, which can be a collimating lens or a focusing lens depending on the desired light profile. Alternatively, the aperture 28 can simply be a flat vertical surface through which the light passes.

As in FIG. 1, the LED elements 10 are arranged such that the optical axis 16 of the transmissive aperture 28 of the optically transparent solid 22 goes through the center 20 (see FIG. 2) of the LED elements and the center is also substantially at the proximity of the center of curvature of the optically transparent solid. In the embodiment shown in FIG. 8, the RGGB LED array of FIG. 2 is shown for illustration purposes only. Persons of ordinary skill in the art will appreciate that any LED array with symmetrically arranged LED elements such as those in FIGS. 2-7 of the present application can be used.

In the embodiment shown, since the index of refraction for the optically transparent solid 22 is substantially higher than one (e.g., 1.5), it is designed to refract the emitting light from the LED elements 10 inwardly such that it only falls on either the reflective surface 26 or the transmissive aperture 28. Accordingly, the sidewall 22 is optically inactive and does not guide the light in any way.

As can be seen, light from the LED element G1 impinging on the spherical reflective surface 26 is reflected back towards the symmetrically arranged LED element G2 and vice versa.

Figure 8B:
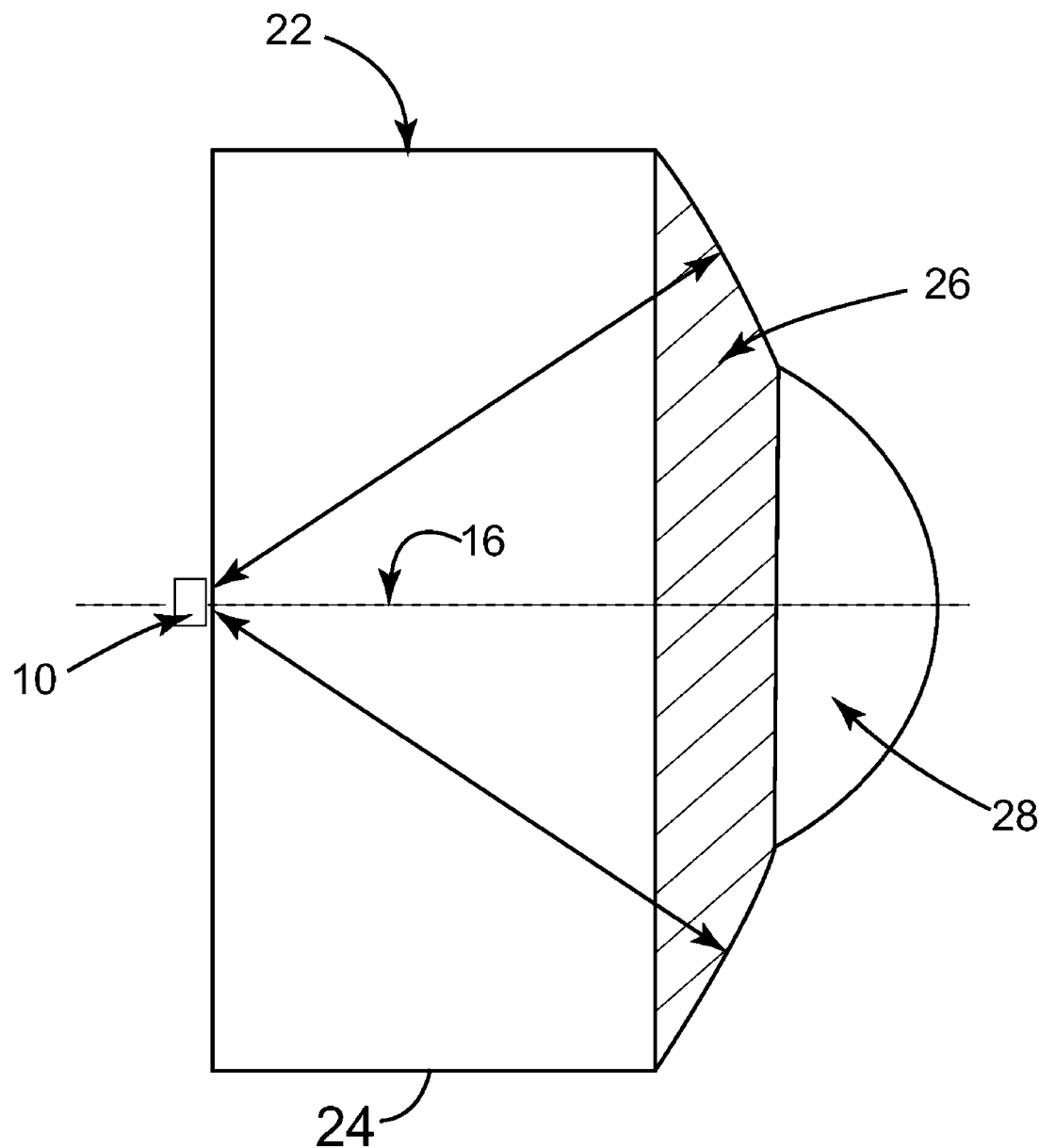
FIG. 8B shows a perspective view of an illumination system having the non-guiding optically transparent solid of FIG. 8A.

FIG. 8B shows a perspective view of an illumination system having the non-guiding optically transparent solid of FIG. 8A.

Figure 9:
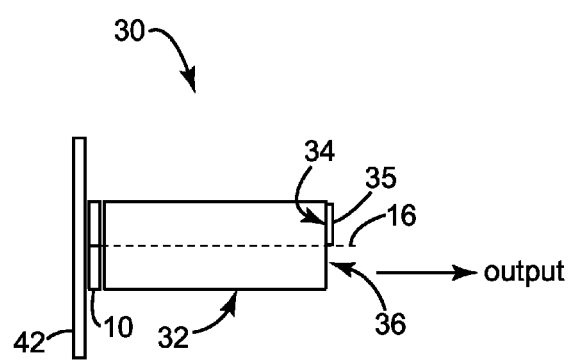
FIG. 9 shows an LED illumination system having with a waveguide light pipe according to an embodiment of the present invention.

FIG. 9 shows an exemplary recycling illumination system 30 where the output of the LED array is coupled into a waveguide light pipe 32. In other words, the waveguide light pipe 32 is used as the recycling reflector of the present invention. Due to the small size of the light pipe 30, this embodiment may be particularly useful where a relatively small illumination system is needed.

The LED elements 10 are attached to a heat sink 42. The waveguide light pipe 32 has a reflective surface 34 and a transmissive aperture 36 through which the LED light passes. The reflective surface 26 can be a reflective coating on the outer surface of the light pipe 32 or part of a separate reflector 35 attached to the outside of the light pipe. As in FIG. 1, the LED elements 10 are arranged such that the optical axis 16 of the light pipe 32 goes through the center 20 (see FIG. 2) of the LED elements.

The reflective surface 34 reflects portions of the light back to the LED elements 10, a portion of which, in turn, will be reflected back towards the aperture 36, thereby increasing the output amount. The net effect is an increase of output per unit emitting area, which equates to an increase in brightness.

In the embodiment shown in FIG. 9, however, the light entering the light pipe 32 is scrambled after multiple reflections. When colored LEDs are used, the colors will be mixed at the LEDs during recycling, thus reducing the recycling efficiency.

Figure 10A:
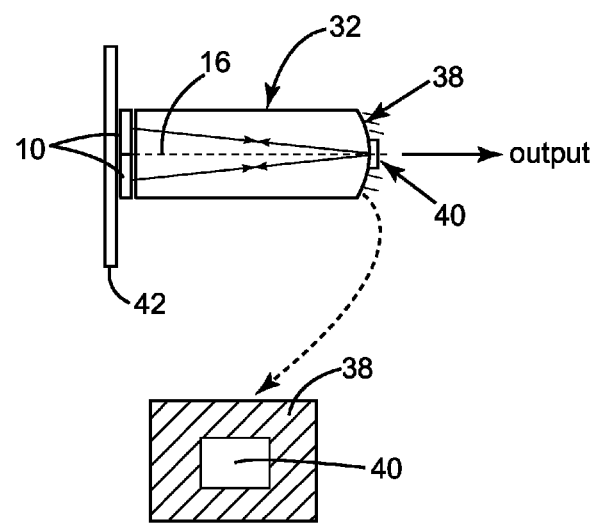
FIG. 10A shows an LED illumination system in which a waveguide light pipe has a curved reflective surface according to an embodiment of the present invention.
Figure 10B:
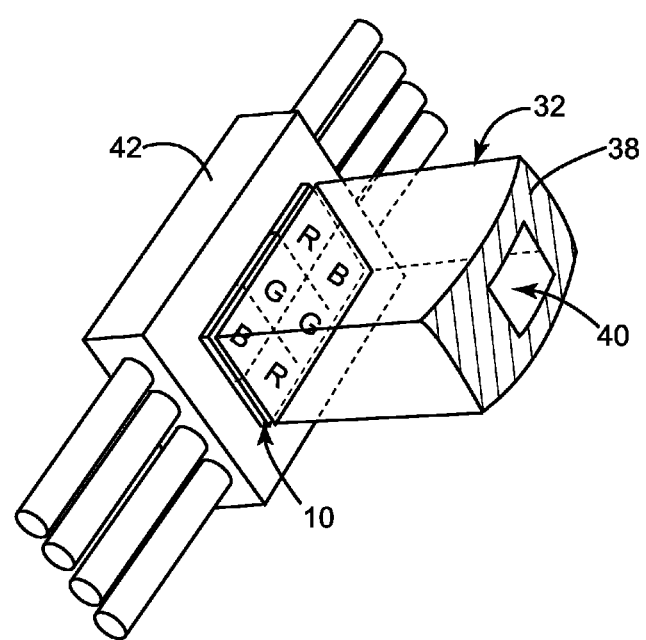
FIG. 10B shows a perspective view of an illumination system having the waveguide light pipe of FIG. 10A.

FIG. 10A shows an embodiment of the invention where a reflective surface 38 of the light pipe 44 is made concave (relative to the LED elements 10) with the curvature adjusted such that lights from the same color LED elements 10 are imaged onto each other symmetrically around the center optical axis 16 of the light pipe. Specifically, light from one LED element impinging on the spherical reflective surface 26 is reflected back towards the symmetrically arranged LED element of same color and vice versa (see arrows in FIG. 10A). The aperture 40 at the output allows light to be coupled out of the system with reduced etendue. FIG. 10B shows a perspective view of an illumination system having the waveguide light pipe of FIG. 10A.

In one embodiment, the radius of curvature of the reflective concave surface 38 is substantially equal to the length of the light pipe. In other words, the reflective surface 38 is spherical in shape relative to the center 20 of the LED array 18. The reduction of the etendue allows efficient coupling of the output to the imaging panel.

As with other types of recycling reflectors disclosed herein, any LED array with symmetrically arranged LED elements such as those in FIGS. 2-7 of the present application can be used with the light pipe 32.

Figure 11:
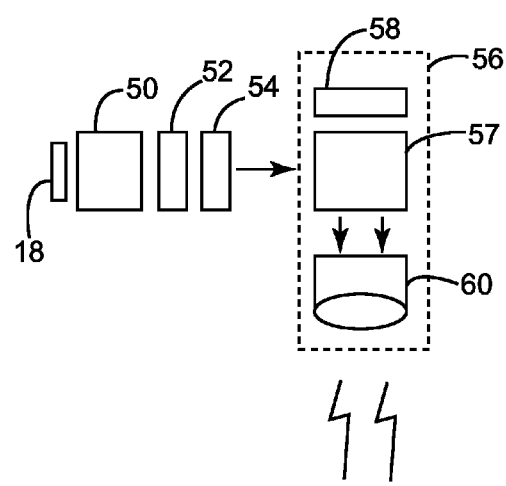
FIG. 11 shows an exemplary projection system incorporating a recycling reflector according to an embodiment of the present invention.

FIG. 11 shows an exemplary projection system incorporating a recycling reflector according to an embodiment of the present invention. The LED array 18 contains symmetrically arranged color LED elements 10. A recycling reflector 50 increases the light output which then goes through a fly eye lens 52 and relay lens 54. The light is then relayed into a projection engine 56 which includes a beam splitter 57, an imaging panel 58 such as LCoS (Liquid Crystal on Silicon) chip and DLP (digital light processing) chip and a projection lens 60. In the projection engine 56, the beam splitter 57 directs the light to the imaging panel 58. The imaged light from the imaging panel 58 returns to the beam splitter 57 and then goes through the projection lens 60 for display on a screen (not shown) with increased brightness according to the invention.

The above disclosure is intended to be illustrative and not exhaustive. This description will suggest many modifications, variations, and alternatives may be made by ordinary skill in this art without departing from the scope of the invention. Those familiar with the art may recognize other equivalents to the specific embodiments described herein. Accordingly, the scope of the invention is not limited to the foregoing specification.

What is claimed is:

1. An LED illumination system comprising:
    an array of at least four LED elements, at least two of which are of the same color, wherein at least one LED element is a different color; and wherein the array has a center; and
    a recycling reflector having an inwardly curved surface facing said array, said reflector thus adapted to reflect the impinging light back to the LED elements, said inwardly curved surface further including a transmissive aperture through which the emitted light passes;
    wherein said transmissive aperture is centered about an optical axis which passes through the center of the array;
    wherein said array is at least substantially at the center of curvature of the curved surface facing the array; and
    wherein at least two LED elements of the same color are diagonally opposed relative to one another on opposite sides of the center of the array such that light from one such same-color LED element which is reflected by said recycling reflector is reflected back to the other same-color LED element.

2. The LED illumination system of claim 1, wherein the inwardly curved surface is hemispherical.

3. The LED illumination system of claim 1, wherein the LED elements are arranged symmetrically about the center of the LED array, and the third and fourth LED elements each emits a color of light different from the same color LED elements.

4. The LED illumination system of claim 3, wherein the LED array includes at least three rows of LED elements emitting light of three different colors (C1, C2, C3), in which the emitting colors of the LED elements are arranged in the following order: C2 in row n; C3, C1, C3 in row n+1; and C2 in row n+2.

5. The LED illumination system of claim 3, wherein the LED array includes at least three rows of LED elements, in which the emitting colors of the LED elements are arranged in the following order: C1, C3 in row n; C2, C2 in row n+1; and C3, C1 row n+2.

6. The LED illumination system of claim 5, wherein the color of C2 is green.

7. The LED illumination system of claim 3, wherein the LED array includes at least three rows of LED elements, in which the emitting colors of the LED elements are arranged in the following order: C1, C2, C3 in row n; C2, X, C2 in row n+1; and C3, C2, C1 in row n+2, in which X is C1, C2, C3 or white color.

8. The LED illumination system of claim 3, wherein the LED array includes at least four rows of LED elements, in which the emitting colors of the LED elements are arranged in the following order: C1, C3 in row n; C2, C2 in row n+1; C2, C2 in row n+2; and C3, C1 in row n+3.

9. The LED illumination system of claim 3, wherein the LED array includes at least four rows of LED elements, in which the emitting colors of the LED elements are arranged in the following order: C2, C2 in row n; C3, C1 in row n+1; C1, C3 in row n+2; and C2, C2 in row n+3.

10. The LED illumination system of claim 3, wherein the LED array includes at least four rows of LED elements, in which the emitting colors of the LED elements are arranged in the following order: C1, C1 in row n; C3, C2, C2, C3 in row n+1; C3, C2, C2, C3 in row n+2; and C1, C1 in row n+3.

* * * * *